(12) United States Patent
Saito et al.

(10) Patent No.: US 9,780,659 B2
(45) Date of Patent: Oct. 3, 2017

(54) SEMICONDUCTOR DEVICE AND DC-TO-DC CONVERTER

(71) Applicant: Kabushiki Kaisha Toshiba, Minato-ku, Tokyo (JP)

(72) Inventors: Hiroshi Saito, Tokyo (JP); Ryo Wada, Kanagawa-ken (JP); Yuichi Goto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/884,566

(22) Filed: Oct. 15, 2015

(65) Prior Publication Data

US 2016/0036331 A1 Feb. 4, 2016

Related U.S. Application Data

(60) Continuation of application No. 13/871,268, filed on Apr. 26, 2013, now Pat. No. 9,189,001, which is a
(Continued)

(30) Foreign Application Priority Data

Dec. 25, 2009 (JP) ................................ 2009-295981

(51) Int. Cl.
*H01L 23/552* (2006.01)
*H02M 3/158* (2006.01)
(Continued)

(52) U.S. Cl.
CPC .............. *H02M 3/158* (2013.01); *G05F 1/46* (2013.01); *H01L 23/495* (2013.01); *H01L 24/49* (2013.01);
(Continued)

(58) Field of Classification Search
CPC ........ H02M 7/003; G05F 1/46; H01L 23/495; H01L 2224/49171; H01L 2924/3011; H01L 2924/13055
(Continued)

(56) References Cited

U.S. PATENT DOCUMENTS 5,814,890 A 9/1998 Iwasaki
5,838,047 A 11/1998 Yamauchi et al.
(Continued)

FOREIGN PATENT DOCUMENTS

CN 1723559 A 1/2006
CN 1862934 A 11/2006
(Continued)

OTHER PUBLICATIONS

MP-1583 3A, 23V Step Down Converter, MP-1583 data manual, Monolithic Poqwer Sytem,pp. 1-11, Jun. 2004.*
(Continued)

*Primary Examiner* — Rajnikant Patel
(74) *Attorney, Agent, or Firm* — White & Case LLP

(57) ABSTRACT

In general, according to one embodiment, a semiconductor device includes a device main body, a semiconductor substrate. The device main body includes a semiconductor substrate mounting part and a first conductor provided around the semiconductor substrate mounting part. The semiconductor substrate includes a DC-to-DC converter control circuit having a detector to detect at least one of a current flowing through the first conductor and a voltage supplied to the first conductor. The semiconductor substrate is disposed on the semiconductor substrate mounting part so that the detector comes close to the first conductor.

20 Claims, 5 Drawing Sheets

Related U.S. Application Data division of application No. 12/883,627, filed on Sep. 16, 2010, now Pat. No. 8,450,803.

(51) Int. Cl.
  *H01L 23/495* (2006.01)
  *H02M 7/00* (2006.01)
  *G05F 1/46* (2006.01)
  *H01L 23/00* (2006.01)
  *H02M 3/156* (2006.01)

(52) U.S. Cl.
  CPC ........... *H02M 3/156* (2013.01); *H02M 7/003* (2013.01); *H01L 2224/05554* (2013.01); *H01L 2224/48247* (2013.01); *H01L 2224/49171* (2013.01); *H01L 2924/00014* (2013.01); *H01L 2924/1205* (2013.01); *H01L 2924/1206* (2013.01); *H01L 2924/1304* (2013.01); *H01L 2924/1425* (2013.01); *H01L 2924/1426* (2013.01); *H01L 2924/3011* (2013.01); *H01L 2924/30107* (2013.01)

(58) Field of Classification Search
  USPC ....... 323/222, 224, 225, 266, 271, 282–290, 323/311, 315, 316; 363/49, 53, 89, 95; 257/253, 299, 355, 368, 414, 430, 723, 257/735, 777
  See application file for complete search history.

(56) References Cited

U.S. PATENT DOCUMENTS

| | | | | |
|---|---|---|---|---|
| 6,462,360 | B1* | 10/2002 | Higgins, Jr. | ........ H01L 21/8221 257/189 |
| 6,462,522 | B2* | 10/2002 | Burstein | ............ H01L 23/5386 257/700 |
| 6,576,956 | B2 | 6/2003 | Kawanaka | |
| 6,867,637 | B2 | 3/2005 | Miyazaki et al. | |
| 6,898,778 | B2 | 5/2005 | Kawanaka | |
| 7,687,902 | B2 | 3/2010 | Shiraishi et al. | |
| 7,923,300 | B2* | 4/2011 | Bell | ................. H01L 21/82348 257/676 |
| 8,058,752 | B2* | 11/2011 | Erickson, Jr. | ............. G05F 1/67 307/150 |
| 8,237,417 | B2* | 8/2012 | Miyamae | ............ H02M 3/1582 323/259 |
| 8,450,803 | B2 | 5/2013 | Saito et al. | |
| 8,564,992 | B2 | 10/2013 | Takahashi et al. | |
| 8,592,904 | B2 | 11/2013 | Shiraishi et al. | |
| 2006/0022298 | A1 | 2/2006 | Shiraishi et al. | |
| 2007/0008679 | A1 | 1/2007 | Takahasi et al. | |
| 2007/0131938 | A1* | 6/2007 | Williams | .............. H01L 27/085 257/77 |
| 2009/0309557 | A1 | 12/2009 | Miyamae | |
| 2010/0225363 | A1 | 9/2010 | Takahashi et al. | |

FOREIGN PATENT DOCUMENTS

| | | | |
|---|---|---|---|
| JP | 2002-084742 A | | 3/2002 |
| JP | 2003-303843 | * | 10/2003 |
| JP | 2003-303843 A | | 10/2003 |
| JP | 2005-026564 A | | 1/2005 |
| JP | 2006-049341 A | | 2/2006 |
| JP | 2008-017620 A | | 1/2008 |
| JP | 2009-303360 A | | 12/2009 |
| JP | 2012-109597 A | | 6/2012 |

OTHER PUBLICATIONS

Chanese Office Action issued on Nov. 12, 2015 in corrsponding Chanese Application No. 201310384817.9.*
Chinese Office Action issued on Apr. 1, 2016 in corresponding Chinese Application No. 201310384817.9, along with English translation thereof.
Japanese Office Action issued on Jul. 25, 2014 in corresponding Japanese Application No. 2013-263092, along with English translation thereof.
Japanese Office Action issued on Mar. 6, 2015 in corresponding Japanese Patent Application No. 2013-263092, along with English translation thereof.
Chinese Office Action issued on Mar. 24, 2015 in corrsponding Chinese Application No. 201310384817.9, along with English translation thereof.
Japanese Office Action for Japanese Application No. 2009-295981 mailed on Nov. 15, 2011, and English translation thereof.
Chinese Office Action for Chinese Application No. 201010270751.7 mailed on Oct. 19, 2012, and English translation thereof.
U.S. Office Action mailed on Oct. 4, 2012 corresponding to U.S. Appl. No. 12/883,627.
MP1583 3A, 23V Step Down Converter, MP1583 data manual, Monolithic Power Sytems, pp. 1-11, Jun. 2004.
Chinese Office Action issued on Nov. 12, 2015 in corrsponding Chinese Application No. 201310384817.9, along with English translation thereof.

* cited by examiner

US 9,780,659 B2

SEMICONDUCTOR DEVICE AND DC-TO-DC CONVERTER

CROSS-REFERENCE TO RELATED APPLICATIONS

This application is a Continuation of application Ser. No. 13/871,268, filed on Apr. 26, 2013, which is a Divisional of application Ser. No. 12/883,627 filed Sep. 16, 2010; now U.S. Pat. No. 8,450,803, that is based upon and claims the benefit of priority from Japanese Patent Application No. 2009-295981, filed on Dec. 25, 2009; the entire contents each of which are incorporated herein by reference.

FIELD

Embodiments described herein relate generally to a semiconductor device and DC-to-DC converter.

BACKGROUND

Switching circuits having switch elements, such as a DC-to-DC converter, for example, have been employing a higher and higher switching frequency to meet the demand for fast response to load change. Further, a parasitic capacitance of a switch element which drives an inductor has been increased with the increase in output current.

In such a switching circuit, ringing tends to occur at both rising and falling edges where an output current or an output voltage changes. Therefore, a usable switching frequency is limited by the time when the ringing converges, and is thus limited by a parasitic capacitance and a parasitic inductance of wiring or the like.

Generally, a semiconductor chip provided with such a switching circuit is mounted and packaged on a lead frame. The semiconductor chip is mounted in the center of the lead frame regardless of the chip size. Further, there is also known a chip-stacked semiconductor device having multiple semiconductor chips stacked and mounted on a substrate to reduce the substrate area. In the case of a semiconductor device of this type in which first and second semiconductor chips are stacked on the substrate, the first semiconductor chip is disposed with a virtual central axis of the first semiconductor offset from the center of the substrate (for example, refer to JP-A 2005-26564 (Kokai)).

However, the package structure as described above has difficulty in reducing the parasitic inductance and the like, and is limited in increasing the usable switching frequency.

DETAILED DESCRIPTION

Figure 1:
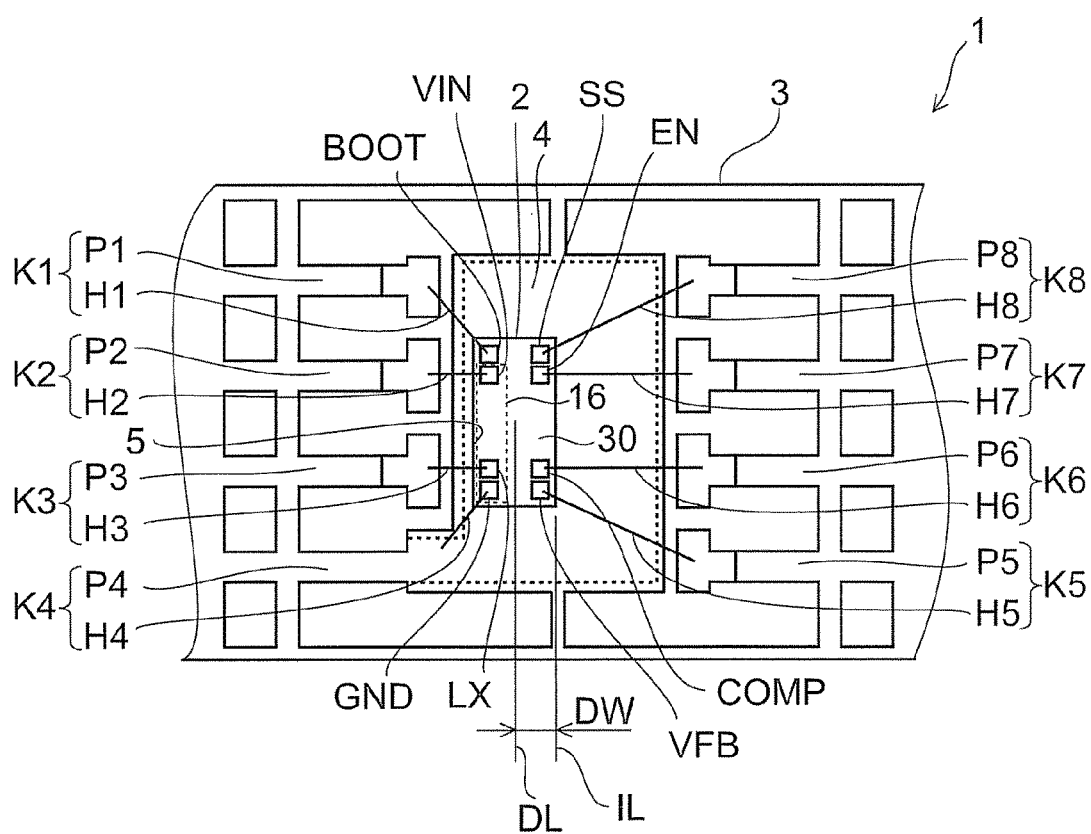
FIG. 1 is a schematic plan view illustrating a configuration of a semiconductor device according to the embodiment.

In general, according to one embodiment, a semiconductor device includes a device main body, a semiconductor substrate. The device main body includes a semiconductor substrate mounting part and a first conductor provided around the semiconductor substrate mounting part. The semiconductor substrate includes a DC-to-DC converter control circuit having a detector to detect at least one of a current flowing through the first conductor and a voltage supplied to the first conductor. The semiconductor substrate is disposed on the semiconductor substrate mounting part so that the detector comes close to the first conductor.

With reference to the drawings, embodiments are described in detail below. The drawings are schematic and conceptual; and shapes of respective portions, relationships between horizontal and vertical dimensions thereof, the proportions of sizes among portions, and the like are not necessarily the same as the actual values thereof. Further, the dimensions and proportions may be illustrated differently among drawings, even for identical portions. In the specification of this application and drawings, components similar to those described previously with reference to earlier drawings are marked with like reference numerals, and a detailed description is omitted as appropriate.

FIG. 1 is a schematic plan view illustrating a configuration of a semiconductor device according to the embodiment.

As shown in FIG. 1, a semiconductor device 1 includes a semiconductor substrate 2 and a device main body 3.

On the semiconductor substrate 2, a DC-to-DC converter control circuit 30 is provided. The DC-to-DC converter control circuit 30 has a detector 16. The semiconductor substrate 2 has four sides.

On the semiconductor substrate 2, a terminal BOOT, a power supply terminal VIN, a first terminal LX, and a ground terminal GND are provided on a first side 5. Terminals VFB, COMP, EN and SS are provided on the opposite side to the first side 5. The power supply terminal VIN, the first terminal LX and the ground terminal GND are connected to the detector 16. The terminals BOOT, VFB, COMP, EN and SS are connected to the DC-to-DC converter control circuit 30.

The device main body 3 includes: a semiconductor substrate mounting part 4 for mounting the semiconductor substrate 2; and first conductors K2 to K4 and second conductors K1 and K5 to K8, which are provided around the semiconductor substrate mounting part 4. The first and second conductors K1 to K8 have multiple pins P1 to P8, wires H1, first wires H2 to H4, and wires H5 to H8.

The pins P2 to P4 of the first conductors K2 to K4 are portions through which at least one of a current and a voltage is supplied to the first conductors K2 to K4 from the opposite side to the semiconductor substrate 2. Moreover, the pins P1 and P5 to P8 of the second conductors K1 and K5 to K8 are portions through which a signal is inputted to or outputted from the second conductors K1 and K5 to K8 from the opposite side to the semiconductor substrate 2.

A virtual center line DL of the semiconductor substrate 2 is disposed to be offset to the first side 5 by an offset amount DW with respect to a virtual center line IL of the semiconductor substrate mounting part 4. Note that FIG. 1 illustrates the configuration in which the device main body 3 has the first and second conductors K1 to K8 on both sides of the semiconductor substrate mounting part 4. However, first and second electrodes may be provided around the semiconductor substrate mounting part 4.

The terminal BOOT and the pin P1 are connected by the wire H1. The pin P1 and the wire H1 make up the second conductor K1. The terminal BOOT serves as a connection part between the second conductor K1 and the semiconductor substrate 2.

The power supply terminal VIN and the pin P2 are connected by the first wire H2. The pin P2 and the first wire H2 make up the first conductor K2. The power supply terminal VIN serves as a connection part between the first conductor K2 and the semiconductor substrate 2. The first terminal LX and the pin P3 are connected by the second wire H3. The pin P3 and the second wire H3 make up the first conductor K3. The first terminal LX serves as a connection part between the first conductor K3 and the semiconductor substrate 2. The ground terminal GND and the pin P4 are connected by the third wire H4. The pin P4 and the third wire H4 make up the first conductor K4. The ground terminal GND serves as a connection part between the first conductor K4 and the semiconductor substrate 2.

The terminal VFB and the pin P5 are connected by the wire H5. The pin P5 and the wire H5 make up the second conductor K5. The terminal COMP and the pin P6 are connected by the wire H6. The pin P6 and the wire H6 make up the second conductor K6. The terminal EN and the pin P7 are connected by the wire H7. The pin P7 and the wire H7 make up the second conductor K7. The terminal SS and the pin P8 are connected by the wire H8. The pin P8 and the wire H8 make up the second conductor K8.

The first wires H2 to H4 and the wires H1 and H5 to H8 are made of, for example, bonding wires, metal sheets or the like.

As described above, the virtual center line DL of the semiconductor substrate 2 is disposed to be offset to the first side 5 with respect to the virtual center line IL of the semiconductor substrate mounting part 4. Thus, the wire H1 and the first to third wires H2 to H4 are shorter than the wires H5 to H8.

In other words, the semiconductor substrate 2 is disposed on the semiconductor substrate mounting part 4 so that the detector 16 comes close to the first conductors K2 to K4. Accordingly, the first conductors K2 to K4 are shorter than they are when the semiconductor substrate 2 is disposed in the center of the semiconductor substrate mounting part 4.

Moreover, the semiconductor substrate 2 is disposed on the semiconductor substrate mounting part 4 so that the detector 16 comes closer to the first conductors K2 to K4 than to the second conductors K5 to K8.

Note that FIG. 1 shows a state of the semiconductor device during assembly thereof, in which the pins P1 to P8 are connected to each other. When the semiconductor device 1 is used after completion of the assembly thereof, connections among the pins P1 to P8 are cut off.

Figure 2:
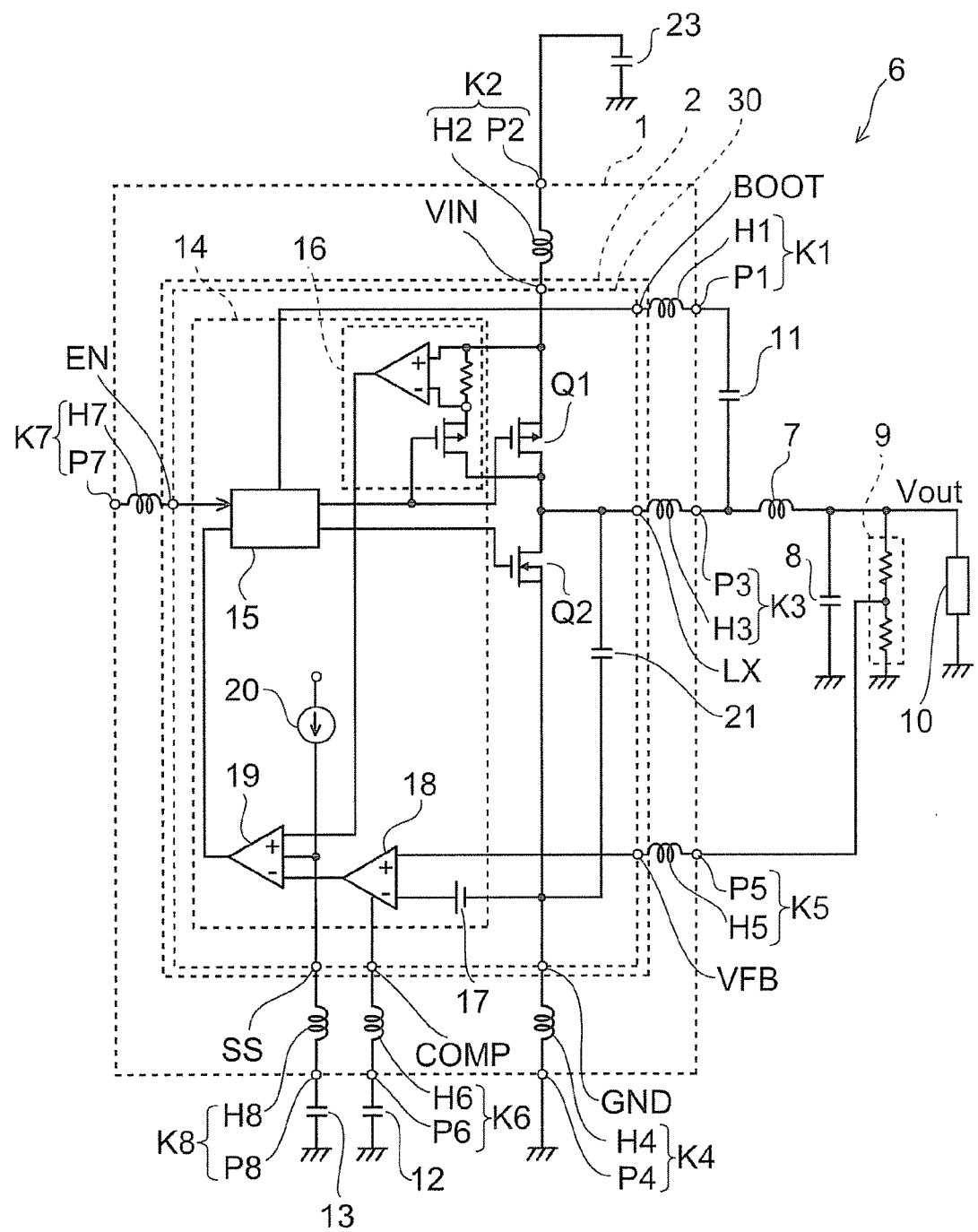
FIG. 2 is a circuit diagram illustrating a DC-to-DC converter including the semiconductor device shown in FIG. 1.

FIG. 2 is a circuit diagram illustrating a DC-to-DC converter including the semiconductor device shown in FIG. 1.

As shown in FIG. 2, a DC-to-DC converter 6 includes the semiconductor device 1, a first inductor 7, a first capacitor 8, a feedback circuit 9 and capacitors 11 to 13.

One end of the first inductor 7 is connected to the pin P3 of the semiconductor device 1 and connected to the first terminal LX through the second wire H3. In other words, the one end of the first inductor 7 is connected to an output of the DC-to-DC converter control circuit 30 through the first conductor K3.

Between the other end of the first inductor 7 and the ground, the first capacitor 8 and the feedback circuit 9 are connected in parallel. Further, a load circuit 10 is connected between the other end of the first inductor 7 and the ground, and an output voltage Vout is outputted to the load circuit 10.

The feedback circuit 9 has a voltage-dividing resistor and feeds back a voltage obtained by dividing the output voltage Vout to the second conductor K5, i.e. the pin P5 of the semiconductor device 1. Note that while the voltage obtained by dividing the output voltage Vout is fed back to the pin P5 in FIG. 2, the output voltage Vout may be fed back to the pin P5.

The capacitor 11 is connected between the second and first conductors K1 and K3 of the semiconductor device 1, i.e. between the pins P1 and P3 thereof. The capacitor 12 is connected between the second conductor K6, i.e. the pin P6 of the semiconductor device 1 and the ground. The capacitor 13 is connected between the second conductor K8, i.e. the pin P8 of the semiconductor device 1 and the ground. Moreover, a power-supply voltage is supplied to the first conductor K2, i.e. the pin P2 of the semiconductor device 1, and the first conductor K4, i.e. the pin P4 of the semiconductor device 1 is connected to the ground. Further, a capacitor 23 is connected as a bypass capacitor between the pin P2 and the ground, and the pin P2 is connected to the ground in respect of alternating currents. An enable signal is inputted to the second conductor K7, i.e. the pin P7 of the semiconductor device 1. Functions of the respective pins P1 to P8 of the semiconductor device 1 are described later.

The DC-to-DC converter 6 steps down the power-supply voltage supplied to the semiconductor device 1 to the output voltage Vout.

The DC-to-DC converter control circuit 30 further includes a first switch element Q1, a second switch element Q2 and a controller 14, which are provided on the semiconductor substrate 2.

The first switch element Q1 has one end connected to the power supply terminal VIN and the other end connected to the first terminal LX. The second switch element Q2 has one end connected to the first terminal LX and the other end connected to the ground terminal GND.

As described above, the power supply terminal VIN, the first terminal LX and the ground terminal GND are connected to the first conductors K2 to K4, respectively, i.e. connected to the pins P2 to P4 in the device main body 3, respectively, through the first to third wires H2 to H4. These first to third wires H2 to H4 are electrically equivalent to a parasitic inductance. Note that cross-sectional areas of the pins P2 to P4 are much larger than those of the first to third wires H2 to H4, and inductances of the pins P2 to P4 are much smaller than those of the first to third wires H2 to H4. Therefore, inductances of the first conductors K2 to K4 are approximately equal to those of the first to third wires H2 to H4. The same goes for the second conductors K1 and K5 to K8.

The pins P2 and P4 are connected to an external power supply and the ground, respectively, and the power-supply voltage is supplied between the pins P2 and P4 as described above.

The first and second switch elements Q1 and Q2 are controlled between ON and OFF states by the controller 14, respectively. When the first switch element Q1 is in the ON state and the second switch element Q2 is in the OFF state, the first terminal LX is connected electrically to the power supply terminal VIN. On the other hand, when the first switch element Q1 is in the OFF state and the second switch element Q2 is in the ON state, the first terminal LX is connected electrically to the ground terminal GND.

The controller 14 includes a driver 15, the detector 16, a voltage generator 17, an error amplifier 18, a comparator 19 and a current generator 20.

The driver 15 drives the first and second switch elements Q1 and Q2 between the ON and OFF states so that the voltage fed back to the terminal VFB, i.e. the output voltage Vout becomes constant. The detector 16 is a current detector which is connected to the power supply terminal VIN, the first terminal LX and the ground terminal GND, and detects, through the first conductors K2 to K4, a current flowing through the first switch element Q1. The detector 16 detects an output current of the DC-to-DC converter control circuit 30 by detecting the current flowing through the first switch element Q1. The detector 16 includes a detecting transistor, a resistor and a differential amplifier.

The voltage generator 17 is a circuit for generating a reference voltage, and is set according to the output voltage Vout. The error amplifier 18 amplifies an error between the voltage inputted to the terminal VFB and the reference voltage generated by the voltage generator 17. The error amplifier 18 is connected to the terminal COMP and connected to the pin P6 through the wire H6. Further, the capacitor 12, for example, is connected to the pin P6 for phase compensation. Note that other circuit configurations are possible for phase compensation.

The comparator 19 has a positive input terminal and two negative input terminals. An output of the detector 16 is inputted to the positive input terminal. An output of the error amplifier 18 is inputted to one of the negative input terminals. The other negative input terminal is connected to the current generator 20 and the terminal SS, and also connected to the pin P8 through the wire H8. For example, the capacitor 13 is further connected to the pin P8. The current generator 20 and the capacitor 13 make up a soft start circuit to control the output voltage Vout at start-up.

The capacitor 13 in its steady state is charged to a fixed potential by the current generator 20. The comparator 19 compares the output of the detector 16 with the output of the error amplifier 18. The comparator 19 outputs a high level when the voltage inputted to the terminal VFB is lower than the reference voltage, and otherwise outputs a low level.

When the output from the comparator 19 is the low level, the driver 15 performs control to extend the ON-state period of the first switch element Q1. On the other hand, when the output from the comparator 19 is the high level, the driver 15 performs control to shorten the ON-state period of the first switch element Q1.

Moreover, the driver 15 is connected to the terminal EN, and connected to the pin P7 through the second conductor K7, i.e. the wire H7. As described above, the enable signal is inputted to the pin P7 from the outside. When the enable signal is at a high level, the driver 15 is set in a normal operation mode for turning on and off the first and second switch elements Q1 and Q2. On the other hand, when the enable signal is at a low level, the driver 15 is set in a standby mode for controlling the first and second switch elements Q1 and Q2 to be set in the OFF state.

The driver 15 is also connected to the terminal BOOT, and connected to the pin P1 through the second conductor K1, i.e. the wire H1. Further, the capacitor 11, for example, is connected between the pins P1 and P3. When the first switch element Q1 is in the OFF state, a current is supplied to the pin P3 through the capacitor 11.

In this way, the DC-to-DC converter control circuit 30 of the semiconductor device 1 uses the controller 14 to control the voltage fed back to the terminal VFB to be constant by turning on and off the first and second switch elements Q1 and Q2. Accordingly, the output voltage is controlled to be constant by the controller 14.

Note that FIG. 2 illustrates the configuration in which the semiconductor device 1 has the second switch element Q2. However, the second switch element Q2 may be replaced by a rectifying element connected so that a current flows in a direction from the ground terminal GND to the first terminal LX.

As described above, the semiconductor device 1 generates, at the output of the DC-to-DC converter control circuit 30, i.e. at the first terminal LX connected to the pin P3, a voltage switched between a power supply potential and a ground potential by turning on and off the first and second switch elements Q1 and Q2.

As described above, between the pin P2 and the power supply terminal VIN where the power is supplied, there is a parasitic inductance generated by the first wire H2. Between the pin P3 and the first terminal LX, there is a parasitic inductance generated by the second wire H3. Between the pin P4 connected to the outside ground and the ground terminal GND, there is a parasitic inductance generated by the third wire H4.

Also, there is a parasitic capacitance between a drain and a back gate of each of the first and second switch elements Q1 and Q2. FIG. 2 equivalently shows a parasitic capacitance 21 connected between the first terminal LX and the ground terminal GND.

As the output current is increased, areas of the first and second switch elements Q1 and Q2 are increased, and a capacitance C of the parasitic capacitance 21 is also increased.

In the voltage generated at the first terminal LX, ringing occurs at both of a rising edge where the voltage changes from the ground potential to the power supply potential and a falling edge where the voltage changes from the power supply potential to the ground potential. Moreover, ringing also occurs in the current flowing through the first and second switch elements Q1 and Q2.

A ringing frequency f0 is expressed by the following formula (1) with the parasitic inductance L and the capacitance C of the parasitic capacitance 21.

$$f0 = \frac{1}{2\pi\sqrt{LC}} \quad (1)$$

The larger the parasitic inductance L and the larger the capacitance C of the parasitic capacitance 21, the longer the ringing cycle. Therefore, the larger the output current, the longer it takes to attenuate and stabilize the ringing of the current.

Accordingly, as the parasitic inductance L and the capacitance C of the parasitic capacitance 21 are increased, it takes longer to stabilize the output of the detector 16.

Incidentally, the parasitic inductance L is approximately proportional to a length of a wire connecting the semiconductor substrate 2 to a lead frame 3.

Table 1 shows, for example, a relationship between a wire length and an offset amount DW of the center DL of the semiconductor substrate 2 with respect to the lead frame 3.

TABLE 1

| Pin | Terminal | Wire length (mm) | |
|---|---|---|---|
| | | DW = 0 μm | DW = 600 μm |
| P1 | BOOT | 1.74 | 1.29 |
| P2 | VIN | 1.58 | 0.99 |

TABLE 1-continued

| Pin | Terminal | Wire length (mm) | |
| | | DW = 0 μm | DW = 600 μm |
| --- | --- | --- | --- |
| P3 | LX | 1.58 | 0.99 |
| P4 | GND | 1.43 | 0.98 |
| P5 | VFB | 1.76 | 2.28 |
| P6 | COMP | 1.43 | 2.03 |
| P7 | EN | 1.43 | 2.03 |
| P8 | SS | 1.76 | 2.28 |

In Table 1, the first column indicates the pins P1 to P8 of the semiconductor device 1. The second column indicates the terminal BOOT, the power supply terminal VIN, the first terminal LX, the ground terminal GND, and the terminals VFB, COMP, EN and SS on the semiconductor substrate 2. The third and fourth columns indicate the wire lengths between the pins P1 to P8 and the respective terminals for a comparative example where the offset amount DW is 0 μm and an example where the offset amount DW is 600 μm.

As shown in Table 1, in the example where the offset amount DW of the semiconductor substrate 2 is 600 μm, the lengths of the wire H1 and the first to third wires H2 to H4 are shorter than those in the comparative example where the offset amount DW is 0 μm. For example, the length of the first wire H2 is 1.58 mm in the comparative example where the offset amount DW is 0 μm, and is reduced to 0.99 mm in the example where the offset amount DW is 600 μm.

Note that while the offset amount DW is set to 600 μm in the example, the offset amount DW is not limited thereto but may be set to DW>0.

The reason why the semiconductor substrate (chip or die) is disposed at the position with the offset amount DW=0 μm as in the comparative example is to mount the semiconductor substrate in the center of the lead frame regardless of the size of the chip (die). In this case, it is difficult to shorten the wires unless a new lead frame (comb) is developed to fit the size of the chip (die).

On the other hand, in the semiconductor device 1 according to the embodiment, the virtual center line DL of the semiconductor substrate 2 is disposed to be offset with respect to the virtual center line IL of the lead frame 3. Therefore, the first to third wires H2 to H4 can be shortened, and the parasitic inductance L can be reduced.

Figure 3A:
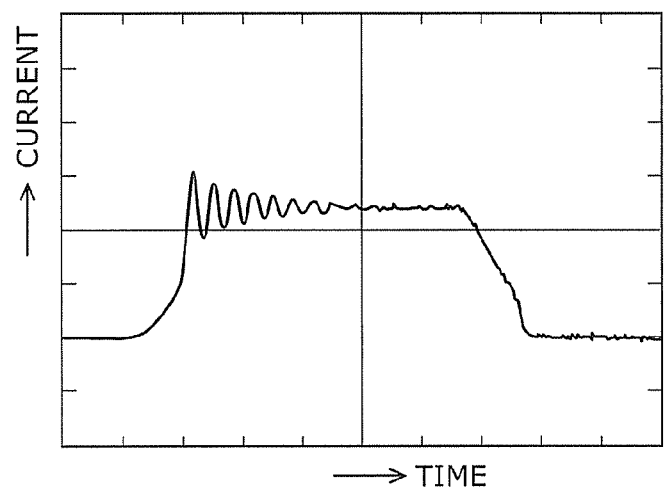
FIGS. 3A and 3B are current waveform diagrams of the first switch element.
Figure 3B:
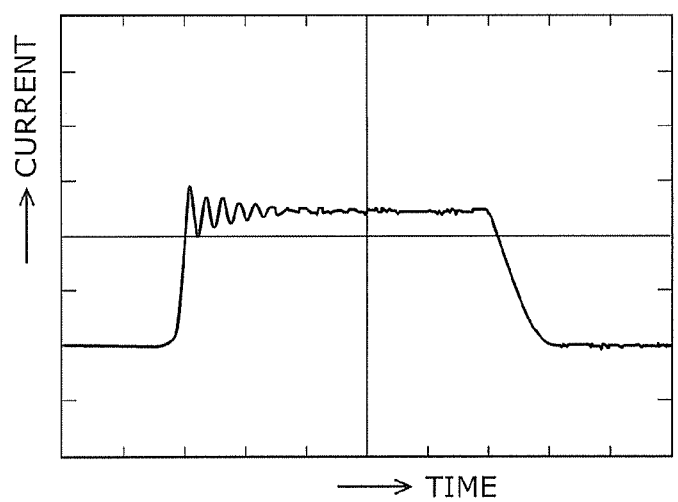

FIGS. 3A and 3B are current waveform diagrams of the first switch element. FIG. 3A shows the case where the offset amount is 0 μm, and FIG. 3B shows the case where the offset amount is 600 μm.

FIGS. 3A and 3B show current waveforms of the first switch element Q1 when the first switch element changes from the OFF state to the ON state, with the horizontal axis indicating time and the vertical axis indicating a current flowing through the first switch element.

In the example where the offset amount DW is 600 μm, the current waveform of the first switch element Q1 converges faster than that in the comparative example where the offset amount DW is 0 μm.

The semiconductor device 1 allows ringing to converge in less time, thereby enabling accurate current detection. For this reason, a high switching frequency is easily realized even in the case of a large current.

Moreover, even in the case of a large current, the DC-to-DC converter 6 can realize a high switching frequency and thus can become more responsive.

Further, the length of the third wire H4 between the pin P4 and the ground terminal GND is also reduced. Accordingly, a parasitic inductance between the pin P4 and the ground terminal GND is also reduced, and thus common mode noise in the ground terminal GND is reduced. As a result, stability and accuracy of the output voltage Vout are improved.

Incidentally, FIG. 2 illustrates the configuration of the controller 14 in a current mode for detecting the current flowing through the first switch element Q1 and controlling the output voltage to be constant. However, the output voltage can also be controlled using a current mode for detecting a current flowing through the second switch element Q2.

Figure 4:
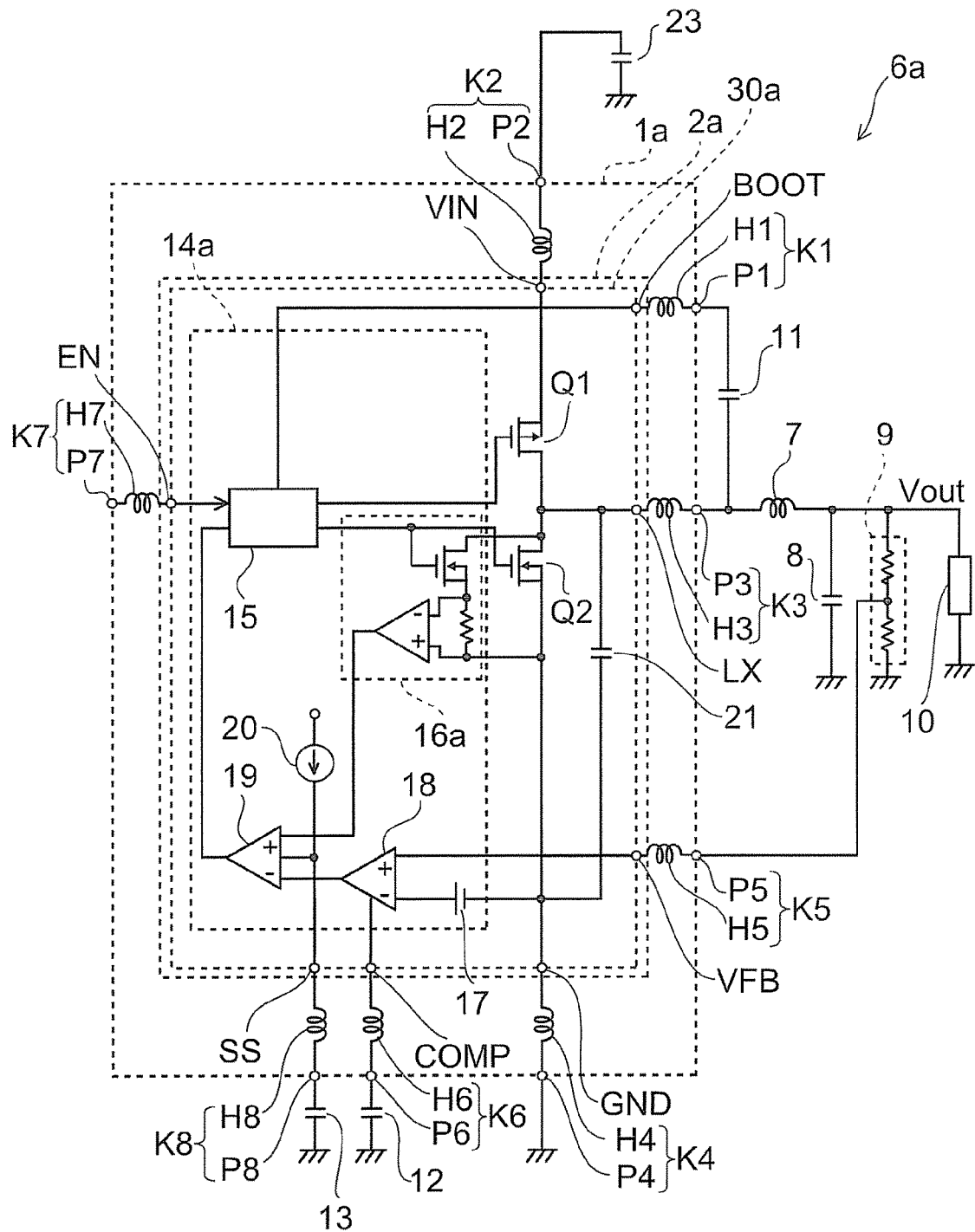
FIG. 4 is a circuit diagram illustrating a DC-to-DC converter according to another embodiment.

FIG. 4 is a circuit diagram illustrating a DC-to-DC converter according to another embodiment.

As shown in FIG. 4, a semiconductor device 1a has a configuration in which the semiconductor substrate 2 shown in FIG. 2 is replaced by a semiconductor substrate 2a. A device main body which is not illustrated, first conductors K2 to K4 and second conductors K1 and K5 to K8 are the same as those in the semiconductor device 1 shown in FIG. 1. In addition, first to third wires H2 to H4, wires H1 and H5 to H8, a first terminal LX, a power supply terminal VIN, a ground terminal GND, and terminals BOOT, VFB, COMP, EN and SS are the same as those in the semiconductor device 1 shown in FIGS. 1 and 2.

To be more specific, in the semiconductor device 1a, a DC-to-DC converter control circuit 30a is provided on the semiconductor substrate 2a. The DC-to-DC converter control circuit 30a has a detector 16a. Note that the terminal BOOT, the first terminal LX, the power supply terminal VIN and the ground terminal GND are provided on a first side (not shown). The terminals VFB, COMP, EN and SS are provided on the opposite side to the first side.

Further, a virtual center line of the semiconductor substrate 2a is disposed to be offset to the first side with respect to a virtual center line of a semiconductor substrate mounting part.

In the DC-to-DC converter control circuit 30a, first and second switch elements Q1 and Q2 and a controller 14a are provided. The controller 14a has a configuration in which the detector 16 in the controller 14 shown in FIG. 2 is replaced by the detector 16a. A driver 15, a voltage generator 17, an error amplifier 18, a comparator 19, a current generator 20 and a parasitic capacitance 21 are the same as those in the controller 14 shown in FIG. 2.

The detector 16a is a current detector which is connected to the power supply terminal VIN, the first terminal LX and the ground terminal GND, and detects, through the first conductors K2 to K4, a current flowing through the second switch element Q2. The detector 16a detects an output current of the DC-to-DC converter control circuit 30a by detecting the current flowing through the second switch element Q2. The detector 16a has the same configuration as that of the detector 16 shown in FIG. 2.

Further, use of the semiconductor device 1a can configure a DC-to-DC converter 6a in a current mode for detecting and controlling the current flowing through the second switch element Q2.

The DC-to-DC converter 6a includes the semiconductor device 1a, a first inductor 7, a first capacitor 8, a feedback circuit 9 and capacitors 11 to 13 and 23.

The DC-to-DC converter 6a has a configuration in which the semiconductor device 1 in the DC-to-DC converter 6 shown in FIG. 2 is replaced by the semiconductor device 1a. The first inductor 7, the first capacitor 8, the feedback circuit 9 and the capacitors 11 to 13 and 23 are the same as those in the DC-to-DC converter 6.

The semiconductor device 1a allows ringing to converge in less time, thereby enabling accurate current detection. For this reason, even in the case of a large current, the DC-to-DC converter 6a can realize a high switching frequency and thus can become more responsive.

Further, the length of the third wire H4 between the first conductor K4, i.e. the pin P4 and the ground terminal GND is also reduced. Accordingly, a parasitic inductance between the pin P4 and the ground terminal GND is also reduced, and thus common mode noise in the ground terminal GND is reduced. As a result, one-point grounding of the ground terminal GND is ensured, and the stable ground potential improves stability and accuracy of the output voltage Vout.

Such stabilization of the potential of the ground terminal GND is effective also in the case where there is no current detector as in the semiconductor devices 1 and 1a.

Figure 5:
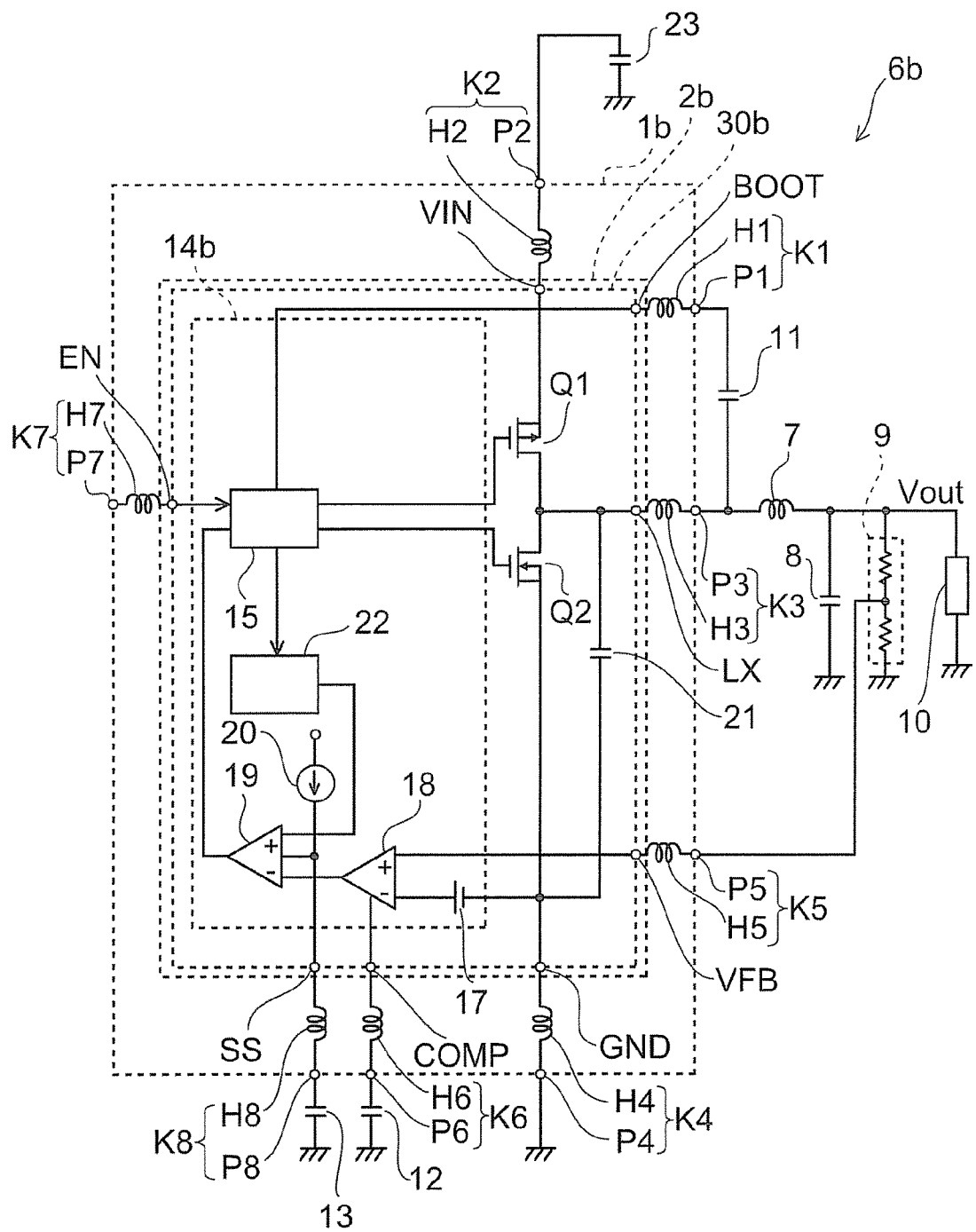
FIG. 5 is a circuit diagram illustrating a DC-to-DC converter according to another embodiment.

FIG. 5 is a circuit diagram illustrating a DC-to-DC converter according to another embodiment.

As shown in FIG. 5, a semiconductor device 1b has a configuration in which the semiconductor substrate 2 shown in FIG. 2 is replaced by a semiconductor substrate 2b. A device main body which is not illustrated, first conductors K2 to K4 and second conductors K1 and K5 to K8 are the same as those in the semiconductor device 1 shown in FIG. 1. In addition, first to third wires H2 to H4, wires H1 and H5 to H8, a first terminal LX, a power supply terminal VIN, a ground terminal GND, and terminals BOOT, VFB, COMP, EN and SS are the same as those in the semiconductor device 1 shown in FIGS. 1 and 2.

To be more specific, in the semiconductor device 1b, a DC-to-DC converter control circuit 30b is provided on the semiconductor substrate 2b. The DC-to-DC converter control circuit 30b has an error amplifier 18. Note that the terminal BOOT, the first terminal LX, the power supply terminal VIN and the ground terminal GND are provided on a first side (not shown). The terminals VFB, COMP, EN and SS are provided on the opposite side to the first side.

Further, a virtual center line of the semiconductor substrate 2b is disposed to be offset to the first side with respect to a virtual center line of a semiconductor substrate mounting part (not shown).

In the DC-to-DC converter control circuit 30b, first and second switch elements Q1 and Q2 and a controller 14b are provided. The controller 14b has a configuration in which the detector 16 in the controller 14 shown in FIG. 2 is replaced by a triangle wave generator 22. A driver 15, a voltage generator 17, the error amplifier 18, a comparator 19, a current generator 20 and a parasitic capacitance 21 are the same as those in the controller 14 shown in FIG. 2.

Here, the controller 14b is connected to the ground terminal GND, to which a ground potential is supplied through the first conductor K4. The semiconductor substrate 2b is disposed so that the third wire H4 of the first conductor K4 is shortened. As a result, one-point grounding is ensured, and thus common mode noise is reduced. Further, the error amplifier 18 detects and amplifies an error in a voltage fed back to the terminal VFB, and thus the output voltage is stabilized. The error amplifier 18 functions as a detector for detecting a voltage.

The triangle wave generator 22 is a circuit for generating a triangle wave synchronized with a switching frequency of the first and second switch elements Q1 and Q2. An output from the triangle wave generator 22 is inputted to a positive input terminal of the comparator 19 to convert the error voltage into time.

In other words, the controller 14b controls the first and second switch elements Q1 and Q2 using a PWM signal whose duty ratio varies according to the magnitude of the error voltage.

Further, use of the semiconductor device 1b can configure a DC-to-DC converter 6b in a voltage mode.

The DC-to-DC converter 6b includes the semiconductor device 1b, a first inductor 7, a first capacitor 8, a feedback circuit 9 and capacitors 11 to 13 and 23.

The DC-to-DC converter 6b has a configuration in which the semiconductor device 1 in the DC-to-DC converter 6 shown in FIG. 2 is replaced by the semiconductor device 1b. The first inductor 7, the first capacitor 8, the feedback circuit 9 and the capacitors 11 to 13 and 23 are the same as those in the DC-to-DC converter 6.

The semiconductor device 1b and the DC-to-DC converter 6b can reduce common mode noise, thereby improving stability. As a result, a high switching frequency can be realized.

Further, the length of the third wire H4 between the ground terminal GND and the pin P4 is also reduced. Accordingly, a parasitic inductance between the ground terminal GND and the pin P4 is also reduced, and thus common mode noise in the ground terminal GND is reduced. As a result, stability and accuracy of the output voltage Vout are improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor device comprising:
   a monolithic semiconductor substrate comprising a switching regulator control circuit, a switch element, an input terminal, an output terminal, a first terminal connectable to a power supply, and a second terminal connectable to a ground and connected to the switch element; and
   a plurality of wires comprising a first wire connected to the input terminal, a second wire connected to the output terminal, a third wire connected to the first terminal, and a fourth wire connected to the second terminal,
   wherein a length of the fourth wire is shorter than a length of the first wire.

2. The semiconductor device according to claim 1, wherein the switch element comprises a first transistor and a second transistor connected to the first transistor in series, and the output terminal is between the first transistor and the second transistor.

3. The semiconductor device according to claim 2, wherein the second terminal is connected to the second transistor.

4. The semiconductor device according to claim 1, wherein the switching regulator control circuit further comprises a driver circuit connected to the input terminal.

5. The semiconductor device according to claim 1, wherein the switching regulator control circuit further comprises an error amplifier connected to the input terminal.

6. The semiconductor device according to claim 1, wherein the input terminal is arranged on a first side on a major surface of the monolithic substrate, and the second terminal is arranged on a second side opposite to the first side on the major surface.

7. The semiconductor device according to claim 1, further comprising;
a mounting portion mounting the monolithic semiconductor substrate; and
a plurality of leads spaced from the mounting portion, each of the plurality of leads connected to each of the wires.

8. The semiconductor device according to claim 7, wherein the semiconductor device has one monolithic semiconductor substrate and one mounting portion.

9. The semiconductor device according to claim 8, wherein the switching regulator control circuit is a DC-to-DC converter control circuit.

10. A DC-to-DC converter comprising:
the semiconductor device according to claim 1;
an inductor connected at one end to the output terminal; and
a capacitor connected to other end of the inductor.

11. A semiconductor device comprising:
a switching regulator control circuit comprising a control circuit, a switch element, an output terminal connected to the switch element, a first terminal connectable to a power supply, a second terminal connectable to a ground and connected to the switch element, and a plurality of input terminals; and
a plurality of wires comprising a first wire connected to the first terminal, a second wire connected to the second terminal, and a plurality of third wires respectively connected to the input terminals,
wherein a length of the second wire is shorter than lengths of the third wires.

12. The semiconductor device according to claim 11, wherein the switch element comprises a first transistor and a second transistor connected to the first transistor in series, and the output terminal is between the first transistor and the second transistor.

13. The semiconductor device according to claim 12, wherein the second terminal is connected to the second transistor.

14. The semiconductor device according to claim 11, wherein the control circuit further comprises a driver circuit connected to one of the input terminals.

15. The semiconductor device according to claim 11, wherein the control circuit further comprises an error amplifier connected to one of the input terminals.

16. The semiconductor device according to claim 11, wherein the switching regulator control circuit is on a semiconductor substrate and the input terminals are arranged on a first side on a major surface of the semiconductor substrate and the second terminal is arranged on a second side opposite to the first side on the major surface.

17. The semiconductor device according to claim 11, further comprising;
a semiconductor substrate comprising the switching regulator control circuit;
a mounting portion mounting the semiconductor substrate; and
a plurality of leads spaced from the mounting portion, each of the plurality of leads connected to each of the wires.

18. The semiconductor device according to claim 17, wherein;
the semiconductor device has the one semiconductor substrate and the one mounting portion.

19. The semiconductor device according to claim 11, wherein the switching regulator control circuit is a DC-to-DC converter control circuit.

20. A DC-to-DC converter comprising:
the semiconductor device according to claim 11;
an inductor connected at one end to the output terminal; and
a capacitor connected to other end of the inductor.

* * * * *